United States Patent
Chang et al.

(10) Patent No.: US 8,040,988 B2
(45) Date of Patent: Oct. 18, 2011

(54) TRANSCEIVER WITH SELECTABLE DATA RATE

(75) Inventors: Kun-Yung K. Chang, Los Altos, CA (US); Kevin S. Donnelly, Los Altos, CA (US)

(73) Assignee: Rambus, Inc., Sunnyvale, CA (US)

( * ) Notice: Subject to any disclaimer, the term of this patent is extended or adjusted under 35 U.S.C. 154(b) by 0 days.

(21) Appl. No.: 11/685,017

(22) Filed: Mar. 12, 2007

(65) Prior Publication Data

US 2007/0147569 A1 Jun. 28, 2007

Related U.S. Application Data

(62) Division of application No. 10/026,371, filed on Dec. 24, 2001, now Pat. No. 7,190,754.

(51) Int. Cl.
*H04L 7/00* (2006.01)
*H04L 7/02* (2006.01)
*H03L 7/00* (2006.01)

(52) U.S. Cl. ........ 375/354; 375/355; 375/357; 375/362; 327/141; 327/145; 327/147

(58) Field of Classification Search .......................... 375/ 240.02–240.07, 240.12, 240.15, 240.26–240.28, 375/316, 319, 354, 355, 357, 359, 362–368, 375/373–376; 327/39–47, 145–149, 153–156, 327/158–159, 231–234, 269–270, 141
See application file for complete search history.

(56) References Cited

U.S. PATENT DOCUMENTS

| | | | | |
|---|---|---|---|---|
| 5,600,379 A * | 2/1997 | Wagner | ........................ | 348/497 |
| 5,666,322 A * | 9/1997 | Conkle | ..................... | 365/230.03 |
| 5,838,749 A * | 11/1998 | Casper et al. | ................. | 375/376 |
| 6,181,505 B1 * | 1/2001 | Sacks et al. | ................. | 360/77.08 |
| 6,754,295 B1 * | 6/2004 | Hartnett | ......................... | 375/356 |
| 6,868,134 B2 * | 3/2005 | Yoshizaki | ...................... | 375/354 |
| 7,319,345 B2 * | 1/2008 | Farjad-rad et al. | .............. | 327/99 |
| 2002/0085656 A1 * | 7/2002 | Lee et al. | ....................... | 375/355 |
| 2003/0079230 A1 * | 4/2003 | Woodward et al. | ............. | 725/90 |
| 2003/0108093 A1 * | 6/2003 | Lai et al. | ....................... | 375/222 |
| 2007/0064850 A1 * | 3/2007 | Tamura | .......................... | 375/355 |
| 2007/0168142 A1 * | 7/2007 | Pan et al. | ........................ | 702/69 |
| 2007/0230966 A1 * | 10/2007 | Walsh | ............................ | 398/155 |
| 2009/0041469 A1 * | 2/2009 | Hofmeister et al. | .......... | 398/138 |

* cited by examiner

*Primary Examiner* — David C. Payne
*Assistant Examiner* — Linda Wong
(74) *Attorney, Agent, or Firm* — Vierra Magen Marcus & DeNiro LLP

(57) ABSTRACT

An integrated circuit device having a selectable data rate clock data recovery (CDR) circuit and a selectable data rate transmit circuit. The CDR circuit includes a receive circuit to capture a plurality of samples of an input signal during a cycle of a first clock signal. A select circuit is coupled to the receive circuit to select, according to a receive data rate select signal, one of the plurality of samples to be a first selected sample of the input signal and another of the plurality of samples to be a second selected sample of the input signal. A phase control circuit is coupled to receive the first and second selected samples of the input signal and includes circuitry to compare the selected samples to determine whether the first clock signal leads or lags a transition of the input signal. The transmit circuit includes a serializing circuit to receive a parallel set of bits and to output the set of bits in sequence to an output driver in response to a first clock signal. A select circuit selects, according to a transmit data rate select signal, data bits within an outbound data value to form the parallel set of bits received within the serializing circuit. Bits within the outbound data value are selected to achieve a first data rate when the transmit data rate select signal is in a first state, and to achieve a second data rate when the transmit data rate select signal is in a second state.

20 Claims, 7 Drawing Sheets

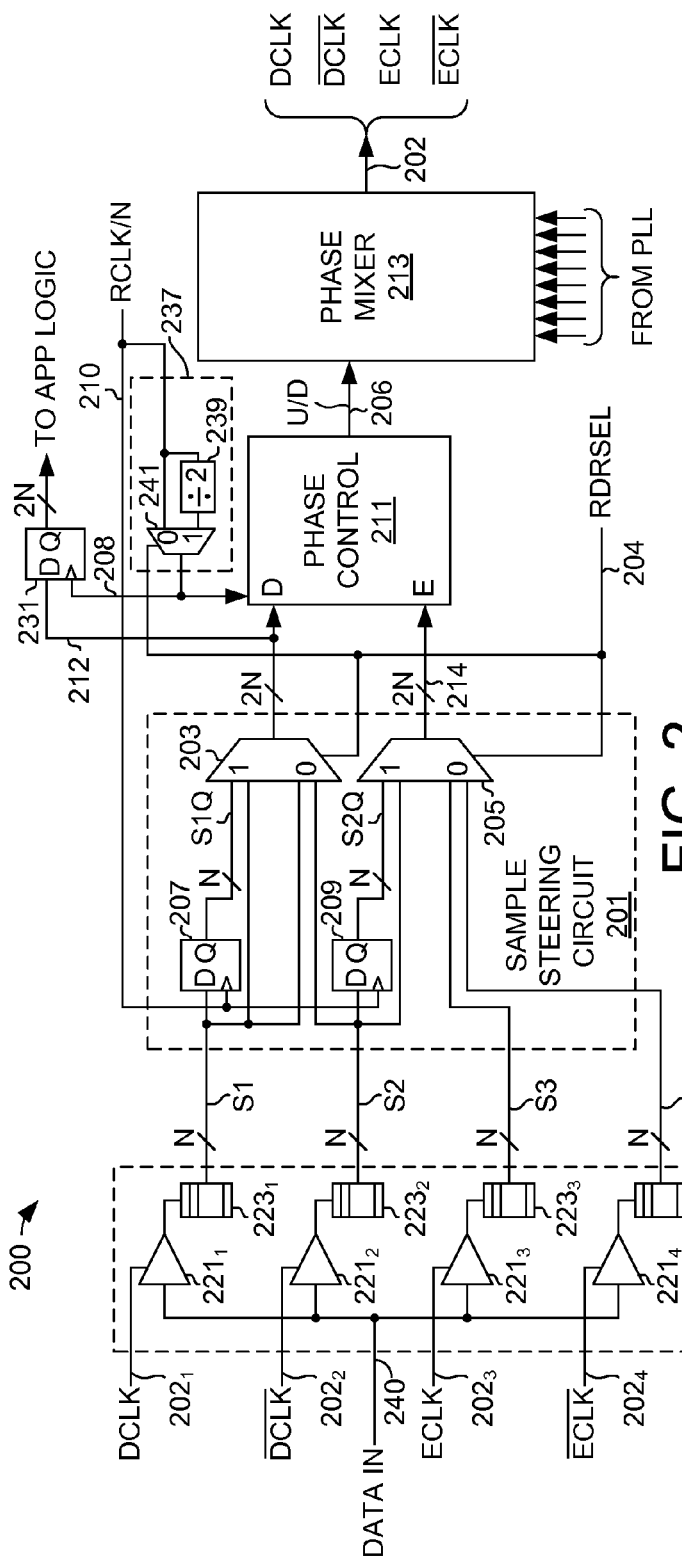
FIG. 2
FIG. 3
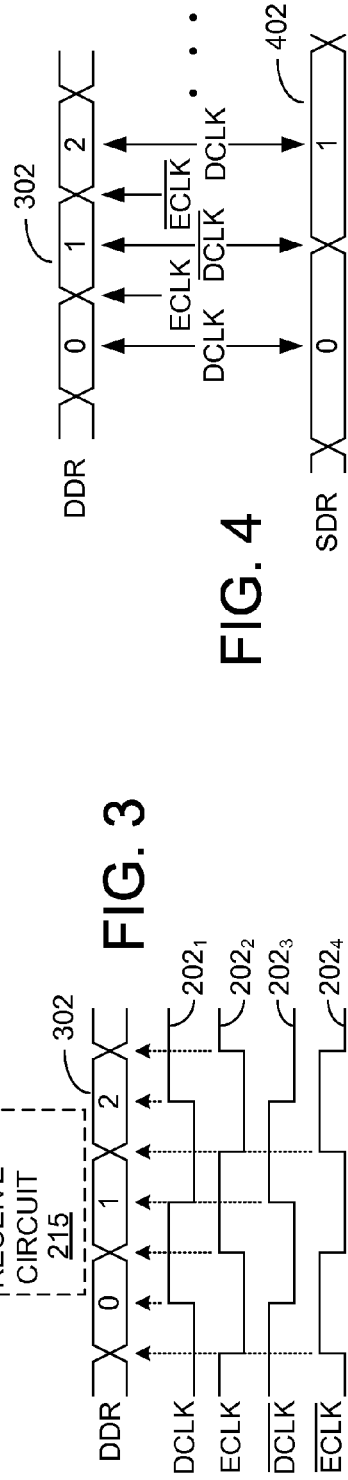
FIG. 4

TRANSCEIVER WITH SELECTABLE DATA RATE

FIELD OF THE INVENTION

The present invention relates to high speed signaling within and between integrated circuit devices.

BACKGROUND

Clock data recovery (CDR) circuits are often used in high speed signaling applications to recover clock and data signals from a signal line. Typically, transitions in an incoming signal are detected and used to generate a clock signal which is used, in turn, to sample data in the incoming signal.

FIG. 1 illustrates a prior art transceiver device 100 that includes a CDR circuit 101, phase locked-loop (PLL) circuit 103, transmit circuit 105 and application logic 107. The PLL circuit 103 outputs a transmit clock (TCLK) to the transmit circuit 105 and a set of eight clock signals, referred to as phase vectors (PV), to the CDR circuit 101. Data recovered by the CDR circuit 101 is provided to the application logic 107 as receive data, and the application logic 107 outputs data to the transmit circuit 105 to transmit the data via a data output path in response to the transmit clock.

In the circuit of FIG. 1, the phase vectors generated by the PLL circuit 103 are offset from one another by successive 45 degree increments such that, considering an arbitrary one of the phase vectors to have a zero degree phase angle, the remaining seven phase vectors have phase angles of 45, 90, 135, 180, 225, 270, and 315 degrees. The phase mixer 113 selects and interpolates between a pair of the phase vectors according to a phase count value to produce a recovered clock signal, RCLK.

The receive circuit 115 captures a number of samples of the incoming data signal during each cycle of the recovered clock signal. The samples are compared with one another within the phase control circuit 111 to determine whether transitions in the incoming data signal occur early or late relative to edges of the recovered clock signal. Based on the early/late determination, the phase control circuit 111 outputs a control signal (U/D) to the phase mixer 115 which responds by increasing or decreasing the phase count value and thereby delaying or advancing the phase of the recovered clock signal. Eventually, the CDR circuit 101 reaches a phase locked condition in which the recovered clock signal has a desired phase relationship to the incoming data signal (e.g., a sampling clock component of the recovered clock signal becomes aligned with the midpoint of data valid intervals of the input signal), and the phase control circuit 111 begins to toggle the control signal between advancing and delaying the phase of the recovered clock signal.

One limitation of the transceiver device 100 is that the CDR circuit 101 and PLL circuit 103 are usually tuned to a particular input data rate. More specifically, the phase-locked frequency of the recovered clock signal is typically limited to a frequency band centered around the PLL output clock frequency (i.e., frequency of the phase vectors) such that, if the data rate falls outside the frequency band, the CDR circuit 101 will be unable to achieve phase lock. In applications where the transceiver device need only support a single input data rate, phase locking of the CDR circuit may be ensured by specifying the PLL output clock frequency and the frequency of the clock used to generate the input data signal (thereby setting the data rate) to be within a predetermined tolerance. Difficulties arise, however, in applications where the transceiver device 100 must support more than one data rate.

The most direct solution to supporting multiple input data rates within the transceiver device 100 is to design the PLL circuit 103 to support a wide range of reference clock frequencies, thereby permitting a wide range of PLL output clock frequencies and a wide band operation of the CDR circuit 101. Unfortunately, wide-range PLL circuits typically exhibit compromised clock fidelity (e.g. increased clock jitter) and therefore tend to be inferior to PLL circuits designed for a narrower frequency range. An alternative solution for supporting multiple input data rates is to use multiple PLL circuits, each optimized for a different input data rate. The disadvantage of this approach is that the increased power, die area, and design effort of the additional PLL circuit(s) make the resulting device more expensive to produce and operate. Thus, it would be desirable to provide a transceiver device that can support multiple input data rates without requiring multiple PLL circuits and without compromising high speed clock performance.

SUMMARY

A transceiver device having a clock data recovery (CDR) circuit that supports multiple input data rates and a transmit circuit that supports multiple output data rates without compromising high-speed clock performance is described below in various embodiments. The CDR circuit includes a sample steering circuit to steer samples of an input data signal, selected according to an input data rate select signal, to an edge input and data input of a phase control circuit. The transmit circuit includes a data steering circuit to steer bits of a data word, selected according to an output data rate select signal, to respective ports of a serializing circuit. In one embodiment, the input and output data rate select signals are generated according to data rate values programmed into a configuration storage circuit within the transceiver device. In an alternative embodiment, the data rate select signals are received directly from a source external to the transceiver device.

These and other features and embodiments of the present invention are described in the detailed description below.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 illustrates a CDR circuit according to one embodiment;

FIG. 3 illustrates the relationship between clock signals recovered by the CDR circuit of FIG. 2 and a double data rate (DDR) input signal;

FIG. 4 illustrates the phase relationship between DDR and single data rate (SDR) input signals, and edges of clock signals recovered by the CDR circuit of FIG. 2;

DETAILED DESCRIPTION

Selectable Data Rate CDR Circuit

Figure 1:
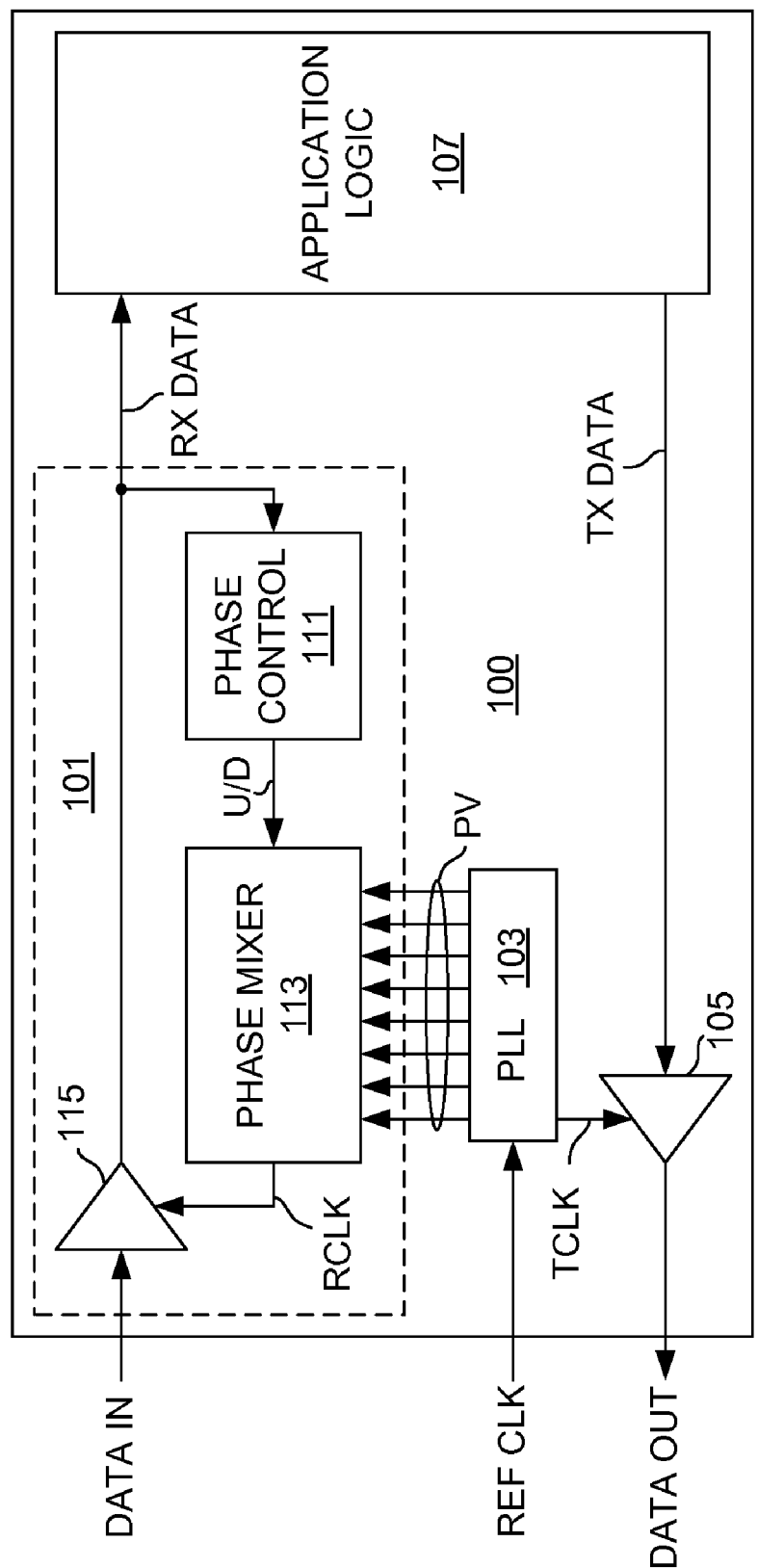
FIG. 1 illustrates a prior-art transceiver device that includes a clock data recovery (CDR) circuit.

FIG. 2 illustrates an embodiment of a clock data recovery (CDR) circuit 200 that may be used within a transceiver device (or other signal receiving device) to support multiple input data rates without requiring wide range PLL operation, or other modification to the high speed clock circuitry. More specifically, the clock data recovery circuit of FIG. 2 is operable to recover a clock signal 202 and data 212 from either a double data rate (DDR) input signal or a single data rate (SDR) input signal. A DDR signal is a signal that includes two data values (e.g., data bits) per cycle of a sampling clock signal and therefore has twice the data rate of an SDR signal, which includes only one data value per sampling clock cycle. As discussed below, alternative embodiments of the present invention are operable to recover a clock signal and a data signal from input signals that include more than two data values per sampling clock cycle and fewer than one data value per sampling clock cycle.

The CDR circuit 200 includes a receive circuit 215, sample steering circuit 201, strobe clock select circuit 237, phase control circuit 211 and phase mixer circuit 213. The phase mixer circuit 213 receives a number of phase vectors 220 from a PLL circuit (eight phase vectors offset from each other by successive 45 degree phase offsets in this example) and interpolates between a selected pair of the vectors to generate a recovered clock signal 202 that includes four component clock signals: a data clock signal (DCLK) and complement data clock signal (/DCLK), and an edge clock signal (ECLK) and complement edge clock signal (/ECLK). In one embodiment, an N-bit phase count value is maintained within the phase mixer 213, with the most significant three bits being used to select between one of eight phase-adjacent pairs of the phase vectors, and the remaining bits being used to interpolate between the selected pair of phase vectors. More or fewer phase vectors may be provided in alternative embodiments. Also, an analog-controlled, rather than digitally-controlled phase mixer, may be used in alternative embodiments.

The four component clock signals $202_1$-$202_4$ of the recovered clock signal 202 are coupled respectively to sample-control inputs of four sampling circuits $221_1$-$221_4$ within the receive circuit 215. A data input line 240 is coupled in common to data inputs of each of the sampling circuits 221, and the output of each sampling circuit 221 is coupled to a respective N-bit shift register 223. By this arrangement, each of the sampling circuits 221 captures one sample of the data signal during each cycle of the recovered clock signal, and loads the corresponding shift register with a new set of N samples every N cycles of the recovered clock signal 202.

FIG. 3 illustrates the relationship between the component clock signals $202_1$-$202_4$ and a DDR input signal 302 after the CDR circuit 200 has achieved phase lock. As shown, a rising edge of the data clock signal $202_1$ occurs at the midpoint of each even phase data eye (i.e., each even-numbered data valid interval within DDR input signal 302) and is used to enable the corresponding sampling circuit $223_1$ to sample (i.e., latch or capture the state of) the even phase data value. Each successive sample captured by the sampling circuit $221_1$ is shifted into the shift register $223_1$ such that, in the case of a DDR input signal, the shift register $223_1$ is reloaded with a new set of N even phase data samples every N cycles of the recovered clock signal 202. Similarly, rising edges of the complement data clock signal $202_3$ occur at the midpoints of odd phase data eyes in the DDR input signal 302 such that shift register $223_2$ is reloaded with a new set of N odd phase data samples every N cycles of the recovered clock signal 202. Rising edges of the edge clock signal $202_2$ are aligned with even-to-odd data transitions in the DDR input signal 302 (i.e., the edge clock transitions are aligned with edges of the data eyes) such that, if an odd phase data value is different from the preceding even phase data value (a data state transition), the signal sample captured in response to the edge clock signal $202_2$ (i.e., the edge clock sample) indicates whether the edge clock signal $202_2$, and therefore all the component clock signals of the recovered clock signal, has transitioned early or late relative to the transition in the input signal 302. That is, an edge clock sample that is equal to the even phase data sample indicates that the edge clock signal transitioned nearer to the even phase data eye than the odd phase data eye and therefore that the recovered clock signal 202 is advanced relative to (i.e., leads) the transition point of the input signal 302. Conversely, an edge clock sample that is equal to the odd phase data sample indicates that the edge clock signal transitioned nearer to the odd phase data eye than the even phase data eye, and therefore that the recovered clock signal 202 lags the transition point of the input signal 302. Rising edges of the complement edge clock signal $202_4$ are aligned with odd-to-even data transitions and therefore provide corresponding lead-lag information when a data state change occurs between odd-to-even data phases of the input signal 302.

FIG. 4 illustrates the phase relationship between DDR and SDR input signals (302 and 402, respectively), and edges of the component clock signals $202_1$-$202_4$. As shown, edges in data clock signal $202_1$ that are used to sample even phase data within the DDR signal 302 are centered (when the CDR circuit is phase locked to an SDR input data signal) within both even and odd phase data eyes of the SDR input signal. Also, edges in the complementary data clock signal occur at transition points between successive data eyes within the SDR signal 402. From this observation, it follows that data state information within the SDR signal 402 is captured by sampling circuit $221_1$ (i.e., in response to transitions in data clock signal $202_1$), while data transition information within the SDR signal is captured by sampling circuit $221_2$. Thus, lead-lag information may be obtained from a SDR input signal by comparing successive data state samples captured by sampling circuit $221_1$ to determine whether a state transition has occurred and, if so, checking for equality between the intervening data transition sample (captured by sampling circuit $221_2$) and either the preceding or succeeding data state sample to determine whether the complementary data clock signal $202_3$ (and therefore all the components of the recovered clock signal 202) leads or lags the input signal transition. Note that in an alternative embodiment, the edge clock signal $202_2$ and complement edge clock signal $202_4$ may be used to obtain data state and data transition samples, respectively, instead of clock signals $202_1$ and $202_2$.

Referring again to FIG. 2, the phase control circuit 211 includes a data input (D) to receive 2N data state samples of the incoming signal (i.e., samples of the incoming signal taken at the midpoints of 2N successive data eyes), and an edge input (E) to receive 2N edge samples of the incoming signal (i.e., samples of the incoming signal taken at the 2N transition points that precede (or follow) the 2N successive data eyes). The sample steering circuit 201 includes multiplexer circuits 203 and 205 to selectively route the samples of the input signal stored in shift registers $223_1$-$223_4$ to the data input and edge input, respectively, of the phase control circuit 211. More specifically, when a data rate select signal 204 (RDRSEL) indicates a DDR mode of operation for the CDR circuit 200 (e.g., DRSEL=0), multiplexer 203 outputs the N data state samples stored in shift register $223_1$ (sample set S1) and the N data state samples stored in shift register $223_2$ (sample set S2) as data state samples 212 to the data input of the phase control circuit 211, and multiplexer 205 outputs the N edge samples stored in shift register $223_3$ (sample set S3) and the N edge samples stored in shift register $223_4$ (sample set S4) as edge samples 214 to the edge input of the phase control circuit 211.

When the input data signal is a DDR signal, 2N data state samples and 2N edge samples are captured every N cycles of the recovered clock signal 202. By contrast, when the input data signal is a SDR signal, 2N cycles of the recovered clock signal 202 are required to capture 2N data state samples and 2N edge samples. In one embodiment, storage circuits 207 and 209 are provided within the sample steering circuit 201 to store sample sets S1 and S2, respectively, in response to every Nth transition of the recovered clock signal 202. (The sample sets stored in storage circuits 207 and 209 are designated S1Q and S2Q, respectively, in FIG. 2.) By this arrangement, 2N data state samples, (i.e., SDR mode data samples S1 and S1Q) and 2N edge samples (i.e., SDR mode edge samples S2 and S2Q) are available to be strobed into the phase control circuit after every 2N cycles of the recovered clock signal. Thus, when the data rate select signal 204 indicates a SDR operating mode for the CDR circuit 200 (e.g., RDRSEL=1), multiplexer 203 outputs sample sets S1 and S1Q as data state samples 212 to the data input of the phase control circuit 211, and multiplexer 205 outputs sample sets S2 and S2Q as edge samples 214 to the edge input of the phase control circuit 211.

Still referring to FIG. 2, the strobe clock select circuit 237 is provided to select either RCLK/N 210 (a clock signal having a frequency equal to the recovered clock frequency divided by N) or RCLK/2N to strobe data state samples 212 and edge samples 214 into the phase control circuit 211, and also to strobe the data state samples 212 into a register 231 for use by application logic elsewhere in the integrated circuit that contains the CDR circuit 200. In the embodiment of FIG. 2, the strobe clock select circuit 231 includes a multiplexer 241 having a control input coupled to receive the data rate select signal 204 and a divider circuit 239 to divide clock signal 210 by two to produce RCLK/2N. When the data rate select signal 204 indicates the DDR operating mode, RCLK/N is selected (i.e., as strobe clock 208) to strobe the 2N data state samples, S1/S2, and 2N edge samples, S3/S4, into the phase control circuit after every N cycles of the recovered clock signal 202. By contrast, when the data rate select signal 204 indicates the SDR operating mode, RCLK/2N is selected to strobe the 2N data state samples, S1/S1Q, and 2N edge samples, S2/S2Q, into the phase control circuit after every 2N cycles of the recovered clock signal 202. In both cases, the 2N data state samples are also strobed into the register 231 for use within the application logic.

Figure 5:
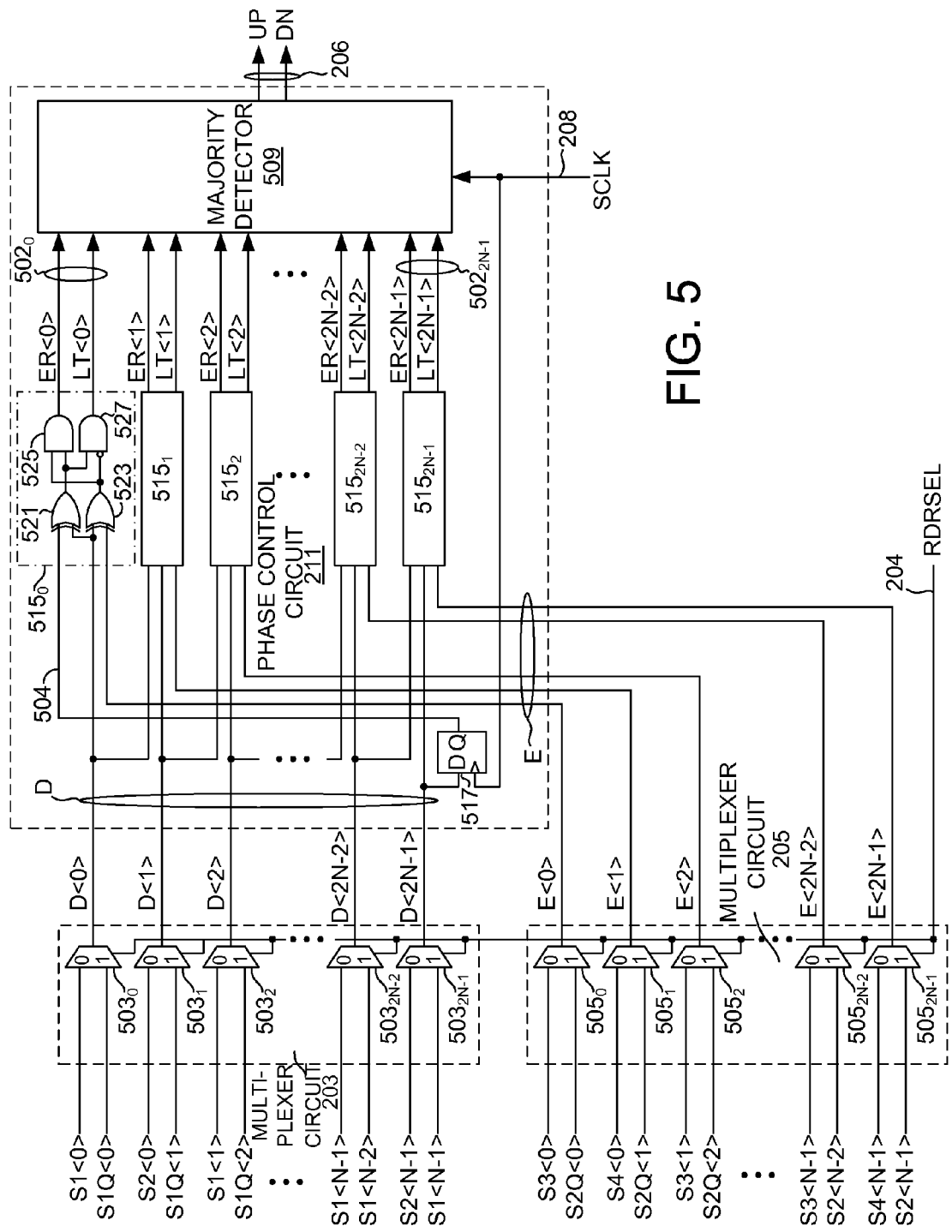
FIG. 5 illustrates exemplary embodiments of multiplexer circuits and the phase control circuit of FIG. 2.

FIG. 5 illustrates exemplary embodiments of the multiplexer circuits 203 and 205, and the phase control circuit 211 of FIG. 2. Multiplexer circuit 203 includes 2N component multiplexer circuits $503_1$-$503_{2N-1}$ to provide selected data state samples D<2N-1:0> to the data input (D) of the phase control circuit 211, and multiplexer circuit 205 similarly includes 2N component multiplexer circuits $505_0$-$505_{2N-1}$ to provided selected edge samples E<2N-1:0> to the edge input (E) of the phase control circuit 211. The selected data state samples and edge samples are input to 2N early/late detection circuits $515_0$-$515_{2N-1}$ within the phase control logic 211 where they are used to generate 2N early/late indicators $502_0$-$502_{2N-1}$. In the embodiment of FIG. 5, each early/late detection circuit 515 includes a first exclusive OR (XOR) logic gate 521 to compare successively captured data state samples and a second XOR logic gate 523 to compare the intervening edge sample with one of the two data state samples. If the successive data state samples are different, a data state transition has occurred (i.e., there is a rising or falling edge at the transition time between the data eyes of the input signal), so that the comparison of the edge sample and the one of the data state samples (the leading data state sample is used in the exemplary embodiment of FIG. 5, though the trailing data state sample may alternatively be used) is indicative of whether the edge sample was captured early or late relative to the data state transition. Thus, if a data state transition has occurred and if the edge sample has the same state as the leading data state sample, the outputs of both XOR gates 521 and 523 will go high, causing AND logic gate 525 to assert (e.g., to an active high state) an early signal, ER<0>, to indicate that the edge sample was captured early relative to the data state transition. Similarly, if a data state transition has occurred and if the edge sample has a different state from the leading data state sample, the outputs of XOR gates 521 and 523 will go high and low, respectively, causing AND logic gate 527 to assert a late signal, LT<0>, to indicate that the edge sample was captured late relative to the data state transition. If no data state transition has occurred, the output of the XOR gate 521 will go low to disable AND gates 525 and 527 from asserting either the early signal or the late signal. The early and late signal output by each early/late detection circuit 515 may be expressed in Boolean notation as follows:

$$ER<i>=(D<i>\oplus D<i-1>) \cdot \text{not}(E<i>\oplus D<i-1>)$$

$$LT<i>=(D<i>\oplus D<i-1>) \cdot (E<i>\oplus D<i-1>),$$

where the '$\oplus$' symbol indicates an exclusive OR (XOR) operation and the '·' symbol indicates a logic AND operation.

Note that the data sample that precedes the D<0> value is the D<2N-1> value from the previous compare cycle (i.e., captured during a previous cycle of the strobe cock signal 208). Accordingly, a storage circuit (a single-bit D flip-flop 517 in this example) is provided to store the D<2N-1> value during each strobe clock cycle for comparison with the D<0> value captured during the following strobe clock cycle. Other logic circuits may be used to generate the early and late signals in alternative embodiments.

Referring again to the multiplexer circuits 203 and 205, in an exemplary embodiment in which N=5, when the data rate select signal 204 indicates a DDR input signal (e.g., RDRSEL=0), the data state samples and edge samples selected to be input to each of ten (i.e., 2N) early/late detection circuits $515_i$ as follows:

TABLE 1

| RDRSEL = 0 (DDR Mode) | | | |
|---|---|---|---|
| i | D<i> | D<i – 1> | E<i> |
| 0 | S1<0> | S2<4>* | S3<0> |
| 1 | S2<0> | S1<0> | S4<0> |
| 2 | S1<1> | S2<0> | S3<1> |
| 3 | S2<1> | S1<1> | S4<1> |

TABLE 1-continued

| | RDRSEL = 0 (DDR Mode) | | |
|---|---|---|---|
| i | D<i> | D<i – 1> | E<i> |
| 4 | S1<2> | S2<1> | S3<2> |
| 5 | S2<2> | S1<2> | S4<2> |
| 6 | S1<3> | S2<2> | S3<3> |
| 7 | S2<3> | S1<3> | S4<3> |
| 8 | S1<4> | S2<3> | S3<4> |
| 9 | S2<4> | S1<4> | S4<4> |

Thus, each early/late detection circuit 515 receives a respective pair of successive data state samples and the intervening edge sample (i.e., the edge sample that falls between the successive data state samples). Note that the S2<4>* sample for the i=0 case is the S2<4 > sample from a prior strobe clock period as discussed above.

Continuing with the N=5 example, when the data rate select signal 204 indicates a SDR input signal, the data state samples and edge samples selected to be input to each of the ten early/late detection circuits 515$_i$ are as follows:

TABLE 2

| | RDRSEL = 1 (SDR Mode) | | |
|---|---|---|---|
| i | D<i> | D<i – 1> | E<i> |
| 0 | S1Q<0> | S1<4>* | S2Q<0> |
| 1 | S1Q<1> | S1Q<0> | S2Q<1> |
| 2 | S1Q<2> | S1Q<1> | S2Q<2> |
| 3 | S1Q<3> | S1Q<2> | S2Q<3> |
| 4 | S1Q<4> | S1Q<3> | S2Q<4> |
| 5 | S1<0> | S1Q<4> | S2<0> |
| 6 | S1<1> | S1<0> | S2<1> |
| 7 | S1<2> | S1<1> | S2<2> |
| 8 | S1<3> | S1<2> | S2<3> |
| 9 | S1<4> | S1<3> | S2<4> |

Thus, as in the DDR mode, each early/late detection circuit 515 receives a respective pair of successive data state samples, and the intervening edge sample. Note that the S1<4>* sample for the i=0 case is the S1<4> sample from a prior strobe clock period as discussed above.

Still referring to FIG. 5, the 2N early/late indicators 502 generated by the early/late detection circuits 515 are strobed into the majority detector 509 in response to the strobe clock signal 208 (note that the input data state and edge samples may also be latched or otherwise stored in the phase control circuit 211 in response to the strobe clock signal 208 in alternative embodiments). The majority detector 509 operates on the 2N early/late indicators 502 by asserting an up-count signal (UP) to delay (i.e., retard) the phase of the recovered clock signal if a majority of the early/late indicators 502 indicate that the edge sample leads the input signal transition (i.e., majority of early/late indicators 502 include an asserted early signal, ER). Similarly, if a majority of the early/late indicators 502 indicate that the edge sample trails the input signal transition (i.e., majority of early/late indicators 502 include an asserted late signal, LT), the majority detector responds by asserting a down count signal (DN) to advance the phase of the recovered clock signal. If no majority of early/late indicators exists, neither the up signal nor the down signal is asserted. Together the up signal and the down signal constitute component signals of the up/down signal 206 of FIG. 2, and may be used to increment or decrement, respectively, a phase count value within the phase mixer, thereby delaying or advancing the phase of the recovered clock signal.

Reflecting on the operation of the CDR circuit 200 of FIG. 2, it should be noted that the frequency of the recovered clock signal 202, including the sampling clock components DCLK, /DCLK, ECLK and /ECLK, remains the same for both SDR and DDR input signals. Thus, by providing the sample steering logic 201 to route, in the low-speed clock domain (i.e., RCLK/N), data state and edge samples to the data and edge inputs of the phase control logic according to the selected data rate, no changes are required in the high speed clock domain to accommodate the two different data rates. That is, no operational change occurs in the receive circuit 215 as the state of the data rate select signal is switched (switching between SDR mode and DDR modes), and no change is required in the frequency of the phase vectors generated by the PLL circuit. Thus, the PLL circuit used to generate the phase vector inputs to the phase mixer 203 may be designed to have a narrow band tuning range centered at the frequency needed to support the highest of multiple data rates (DDR in this example), thereby avoiding the clock jitter that plagues wide range PLL circuits. Also, because the phase vector frequency does not need to be changed as different data rates are selected, only one PLL circuit is required.

Extensions of Selectable Data Rate CDR Circuit

Figure 6:
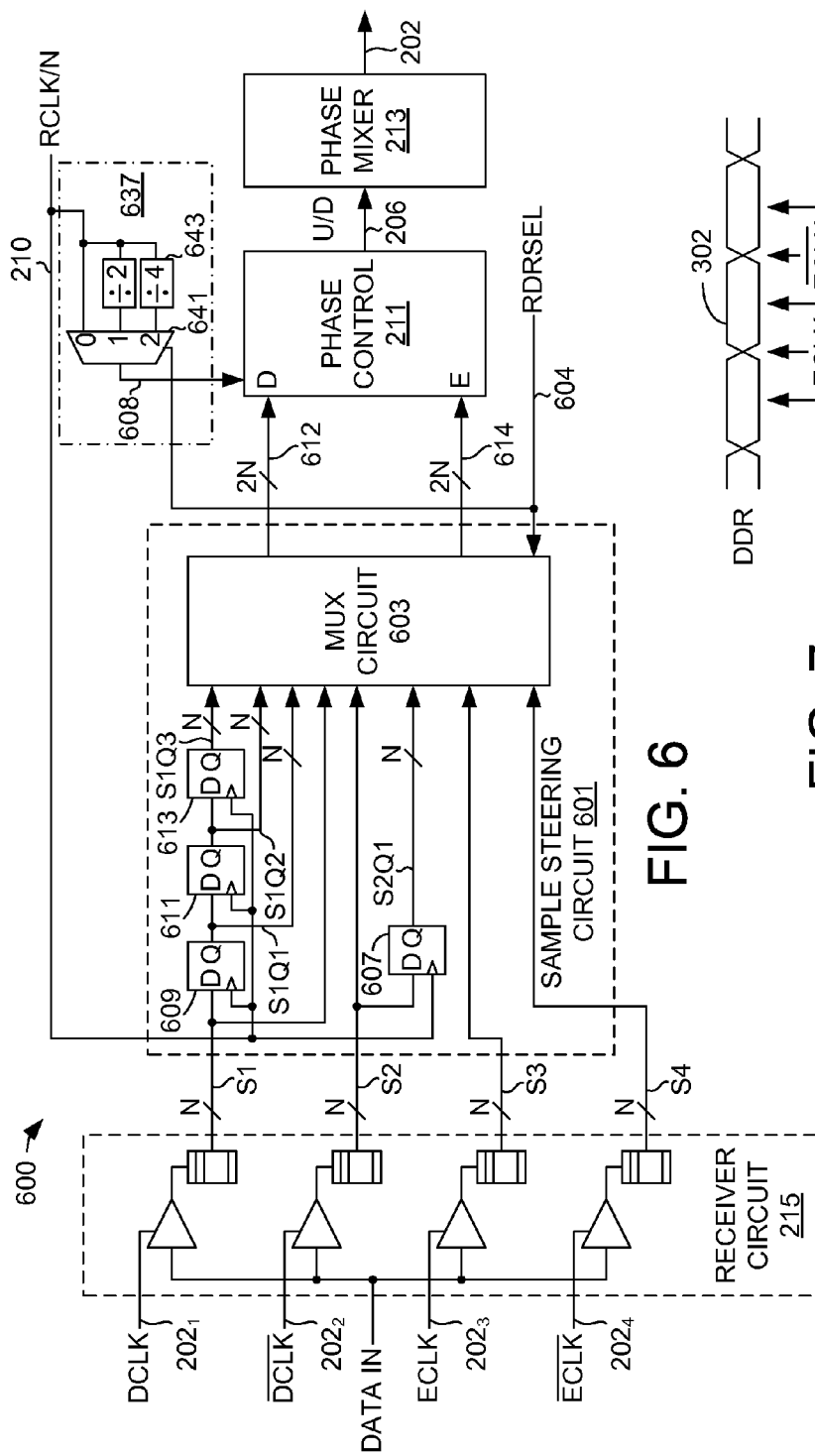
FIG. 6 illustrates an embodiment of a selectable data rate CDR circuit that can be used to recover data and clock from half-data rate (HDR) input signals as well as DDR and SDR input signals.

FIG. 6 illustrates an embodiment of a selectable data rate CDR circuit 600 that can be used to recover data and clock from half-data rate (HDR) input signals as well as DDR and SDR input signals (note that the receive data rate select signal may include multiple bits and therefore select between more than two data rates). The receiver circuit 215, phase control circuit 211 and phase mixer circuit 213 operate as described in reference to FIGS. 2 and 5 to generate a recovered clock signal having components DCLK, /DCLK, ECLK and /ECLK, and to capture sample sets S1-S4 every N cycles of the recovered clock signal 202. The sample steering circuit 601 includes a multiplexer circuit 603, three N-bit storage circuits (609, 611, 613) to store three successively captured S1 sample sets (S1Q1, S1Q2, S1Q3), and an N-bit storage circuit 607 to store one S2 sample set (S2Q1). In DDR mode, sample sets S1, S2, S3 and S4 are selected by the multiplexer circuit 603 to be input to the data and edge sample inputs of the phase control circuit 211 as set forth in Table 1 above. In SDR mode, sample sets S1Q1, S1, S2Q1 and S2 are selected by the multiplexer circuit 603 to be input to the data and edge sample inputs of the phase control circuit as set forth in Table 2 above.

Figure 7:
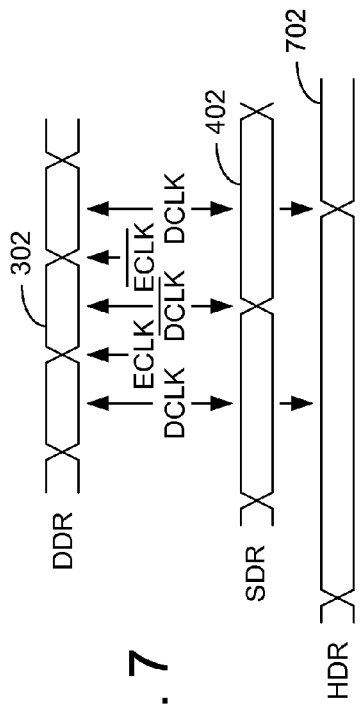
FIG. 7 illustrates the phase relationship between DDR, SDR and HDR input signals, and edges of clock signals recovered by the CDR circuit of FIG. 6.

When the CDR circuit is phase locked to an HDR input signal, all data eyes and data transitions in the input signal are aligned with an edge of one of the component clock signals; the rising edge of the data clock signal (DCLK) in this example. More specifically, as shown in FIG. 7, each successive data clock sample alternately samples a data state and a data transition in the HDR input signal. Consequently, 4N clock cycles are required to capture 2N data state samples and 2N edge samples in an incoming HDR signal, with each set of N samples being captured by a single one of the sampling circuits within receiver circuit 215, and each sample set including both data state and edge samples. Thus, in the embodiment of FIG. 6, when the data rate select signal 604 selects the HDR mode, sample sets S1, S1Q1, S1Q2 and S1Q3 (making up a total of 4N samples captured over 4N cycles of the recovered clock signal 202) are selected by the multiplexer circuit 603 to be distributed to the data and edge sample inputs of the phase control circuit 211. Also, because 4N clock cycles are needed to acquire a full complement of 2N data state samples and 2N edge samples, a divide by four circuit 643 is selected by a multiplexer 641 within strobe clock select circuit 637 to provide a strobe clock signal 608 having a frequency of RCLK/4N (i.e., dividing clock signal 210 by four). As in CDR circuit 201 of FIG. 2, the selected strobe clock 608 is used to strobe the data state and edge samples into the phase control circuit 211 and also into a storage circuit (not shown in FIG. 6) for use by application logic or other circuitry.

Still referring to FIG. 6, in an exemplary embodiment in which N=5, data samples D<9:0> and edge samples E<9:0> are input to the data and edge sample inputs of the phase control circuit 211 for use in a respective early/late detection circuit (i.e., $515_i$ as shown in FIG. 5) in accordance with the following table:

TABLE 3

HDR Mode

| i | D<i> | D<i – 1> | E<i> |
|---|------|----------|------|
| 0 | S1Q3<1> | S1<4>* | S1Q3<0> |
| 1 | S1Q3<3> | S1Q3<1> | S2Q3<2> |
| 2 | S1Q2<0> | S1Q3<3> | S1Q3<4> |
| 3 | S1Q2<2> | S1Q2<0> | S1Q2<1> |
| 4 | S1Q2<4> | S1Q2<2> | S1Q2<3> |
| 5 | S1Q1<1> | S1Q2<4> | S1Q1<0> |
| 6 | S1Q1<3> | S1Q1<1> | S1Q1<2> |
| 7 | S1<0> | S1Q1<3> | S1Q1<4> |
| 8 | S1<2> | S1<0> | S1<1> |
| 9 | S1<4> | S1<2> | S1<3> |

Thus, as in the DDR and SDR modes, each early/late detection circuit receives a respective pair of successive data state samples, and intervening edge sample. Note that the S1<4>* sample for the i=0 case is the S1<4> sample from a prior strobe clock period as discussed above.

Reflecting on the overall operation of the selectable data rate CDR circuits described in reference to FIGS. 2-7, it should be noted that clock signals ECLK and /ECLK may be used to sample data and edges in SDR mode rather than data clocks DCLK and /DCLK. Also, any one of the four component clock signals may be used to capture data and edge samples of the HDR signal, and falling clock edges may be used instead of rising clock edges to strobe the sampling circuits within the receive circuit 215. Further, while the CDR circuits described in reference to FIGS. 2-6 each generate four component clock signals (i.e., DCLK, /DCLK, ECLK and /ECLK), more or fewer component clock signals may be generated in alternative embodiments. For example, if an input signal includes four data values per cycle of the recovered clock signal (i.e., a quad data rate (QDR) input signal), eight component clock cycles may be used to sample the input signal at even phase offsets of 45 degrees, with sample steering circuitry used to select appropriate data state and edge samples for the QDR, DDR, SDR, HDR, etc. data rate selections.

Selectable Data Rate Transmit Circuit

Figure 8:
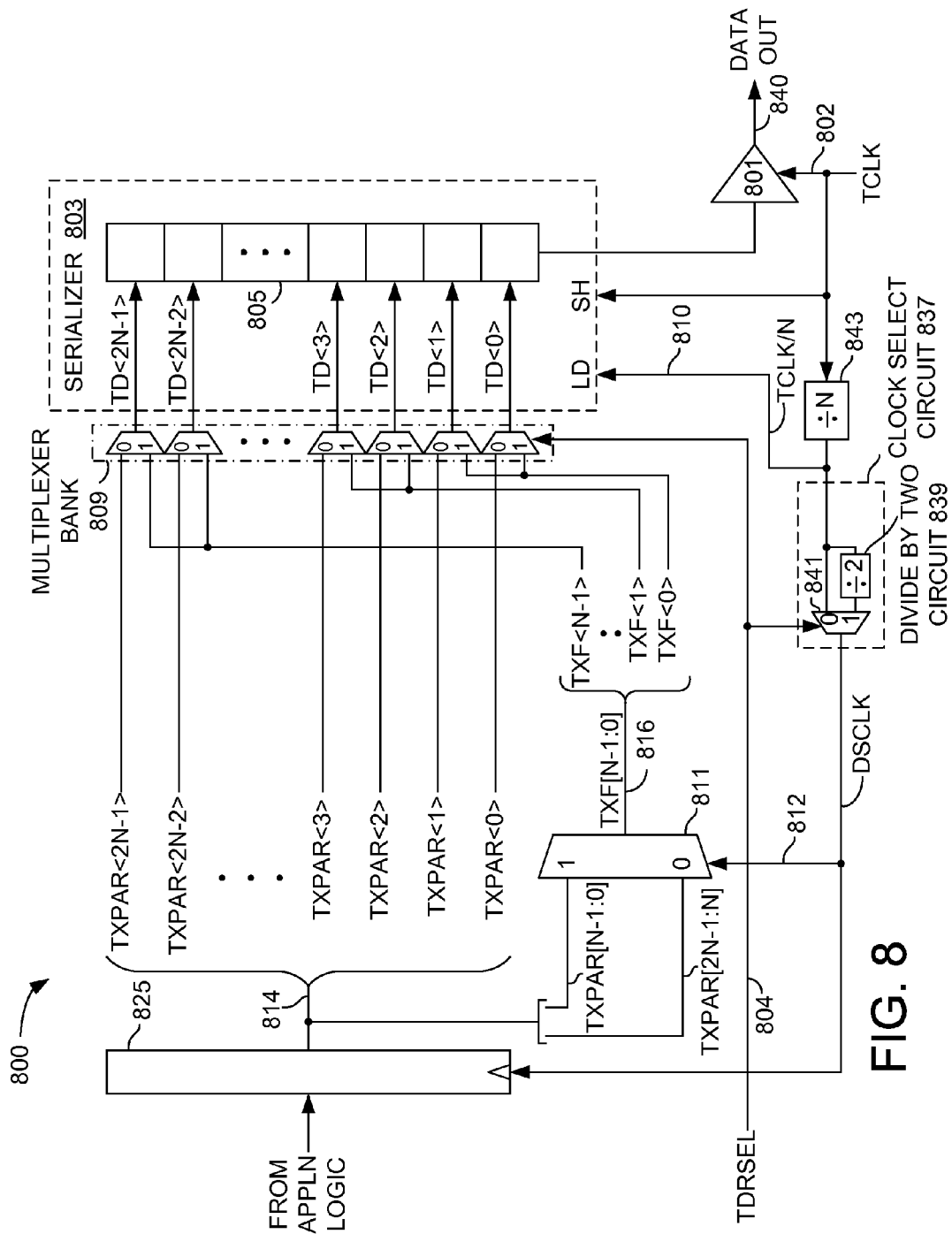
FIG. 8 illustrates a selectable data rate transmit circuit 800 according to one embodiment.

FIG. 8 illustrates a selectable data rate transmit circuit 800 that may be used within a transceiver device (or other signal transmitting device) to support multiple output data rates without requiring wide range PLL operation or other modification to the high speed clock circuitry. In the exemplary embodiment shown, a transmit data rate select signal 804 (TDRSEL) is used to select between a DDR output data rate and a SDR output data rate. The data rate select signal 804 may be provided from a programmable storage circuit (including a one-time programmable or fusible circuit) within the device that includes the transmit circuit 800 or from an external source. Also, the data rate select signal 804 may be the same data rate select signal used to control a receive data rate (i.e., RDRSEL signal 204 discussed above in reference FIG. 2) or distinct from the data rate select signal used to control the receive data rate.

An outbound data word is supplied to the transmit circuit 800 (e.g., from application logic) and stored in a transmit data register 825 during each cycle of a data supply clock signal 812 (DSCLK) in the form of 2N parallel bits (TXPAR[2N-1:0]). If the data rate select signal 804 indicates a DDR mode (e.g., TDRSEL=0), then a multiplexer 841 within a clock select circuit 837 selects a load clock signal 810 having frequency TCLK/N (i.e., generated by divider circuit 843 which divides a high-speed transmit clock 802 by N) to be the data supply clock signal 812. Thus, in the DDR mode, 2N parallel bits of outbound data are loaded into the transmit data register 825 every N cycles of the transmit clock signal. A multiplexer bank 809 is responsive to the data rate select signal 804 to select the 2N parallel bits, TXPAR[2N-1:0], to be presented at the input of a 2N-bit deep shift register 805 within a serializer circuit 803. The selected bits are loaded into the shift register 805 in response to a transition of the load clock signal 810 (e.g., at a rising edge detected at load input, LD, though a falling edge may alternatively be used). The shift register 805 is responsive to the transmit clock signal 802 (received at a shift input (SH)) to shift the loaded bits one after another (i.e., serially) to the input of the output driver 801. In the embodiment of FIG. 8, the bits within shift register 805 are shifted during each half cycle of the transmit clock signal 802 such that two bits are shifted out of the shift register 805 and driven onto output path 840 during each cycle of the transmit clock signal 802. Thus, the shift register 805 is emptied and ready to be reloaded every N cycles of the transmit clock signal 802.

When the data rate select signal 804 indicates an SDR mode of operation (i.e., TDRSEL=1), a divide by two circuit 839 within the clock select circuit 837 is selected to supply a data supply clock signal 810 having frequency TCLK/2N (i.e., frequency of the transmit clock signal 802 divided by 2N). Accordingly, in SDR mode, 2N bits are loaded into the transmit data register 825 once every 2N cycles of the transmit clock signal 802, and therefore once every two cycles of the load clock signal 810. A first half of the 2N parallel bits, TXPAR [N-1:0], is selected by field select circuit 811 (depicted as a multiplexer in FIG. 8) to be input to the multiplexer bank 809 during a first half cycle of the data supply clock signal 812, and a second half of the 2N parallel bits, TXPAR [2N-1:N], is selected to be input to the multiplexer bank 809 during the second half cycle of the data supply clock signal 812. By this arrangement, upper and lower N-bit fields of the 2N parallel data bits are selected in succession for output to the multiplexer bank 809 (i.e., as bits TXF[N-1:0]). Also, each bit within a selected N-bit field is input to a respective pair of multiplexers within multiplexer bank 809 to form an overall set of 2N bits at the input of multiplexer bank 809. When the data rate select signal indicates the SDR mode, the multiplexer bank 809 selects the field select circuit 811 to source the data to be loaded into the shift register such that each of the two N-bit fields output from the field select circuit 811 are loaded in succession into the shift register 805. Because of the duplicated bit entry at respective pairs of multiplexers within multiplexer bank 809, each adjacent pair of storage elements within the 2N-bit shift register is loaded with the same datum in the SDR mode. That is, TD<0>=TD<1>, TD<2>=TD<3>, . . . , and TD<2N-2>=TD<2N-1>. Consequently, even though two bits are shifted out of the shift register 805 and output onto the output data path 840 during each cycle of the transmit clock signal, the bits are duplicated such that no transition occurs in the interval between the bits. Thus, even though the shift register and output driver are still operating at the same rate (and in response to the same frequency clock signal) as in the DDR mode, a SDR output is achieved. In effect, the multiplexer bank 809, clock selector 837, and field select circuit 811 form steering logic to selectively steer outbound data bits to inputs of the serializer 803 such that different output data rates are achieved without changing the frequency of the transmit clock signal 802 or otherwise modifying circuitry in the high speed clock domain.

Figure 9:
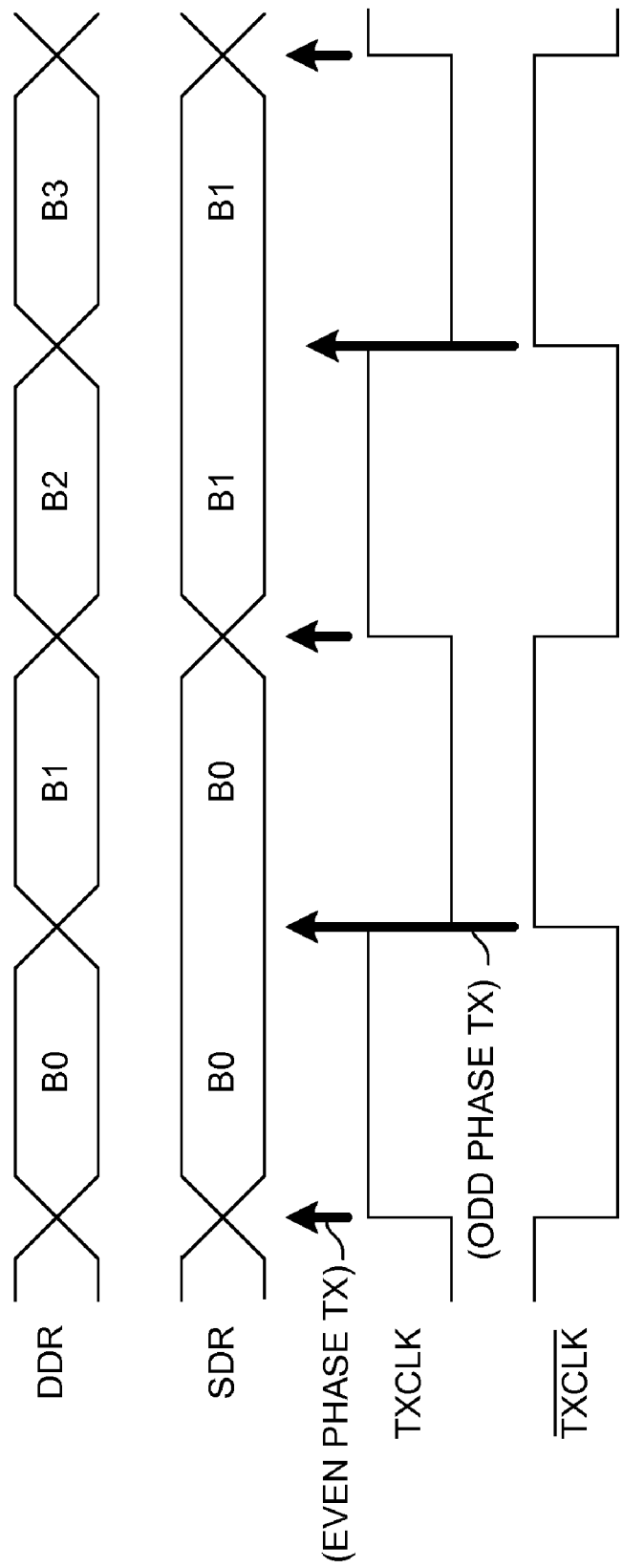
FIG. 9 illustrates output waveforms generated at different data rates by the selectable data rate transmit circuit of FIG. 8.

FIG. 9 illustrates output waveforms generated at different data rates by the selectable data rate transmit circuit 800 of FIG. 8. As shown, successive bits (B0, B1, B2, . . . ) of a DDR signal are output during respective half cycles of a transmit clock signal, TXCLK (note that, in one embodiment, the transmit clock signal 802 (TCLK) of FIG. 8 includes the two complementary component clock signals TXCLK and /TXCLK shown in FIG. 9). Thus, even numbered data bits (B0, B2, etc.) are output in response to rising edges of TXCLK (even phase transmissions), and odd numbered bits (B1, B3, etc.) are output in response to rising edges of /TXCLK (odd phase transmissions). By contrast, each constituent bit of the SDR output waveform is transmitted twice; once during the even phase transmission and once during the odd phase transition. Accordingly, even though data is still being transmitted every half cycle of the transmit clock signal (i.e., no change in the transmit clock frequency), a SDR waveform is achieved.

Reflecting on the operation of the selectable data rate transmit circuit 800 of FIG. 8, it should be noted that selection between data rates greater than DDR and less than SDR may be achieved. For example, a transmit circuit having quadrature transmit clocks (i.e., four component clock signals of a transmit clock having an even phase distribution within a 360 degree cycle) may be used to generate a QDR output signal in a first mode, a DDR output signal in a second mode (e.g., by outputting each bit twice in succession), a HDR output signal in a third mode (e.g., by outputting each bit four times in succession), and so forth, all without changing the transmit clock frequency or otherwise modifying circuitry within the high speed clock domain.

System Application of Selectable Data Rate Transceiver Circuit

Figure 10:
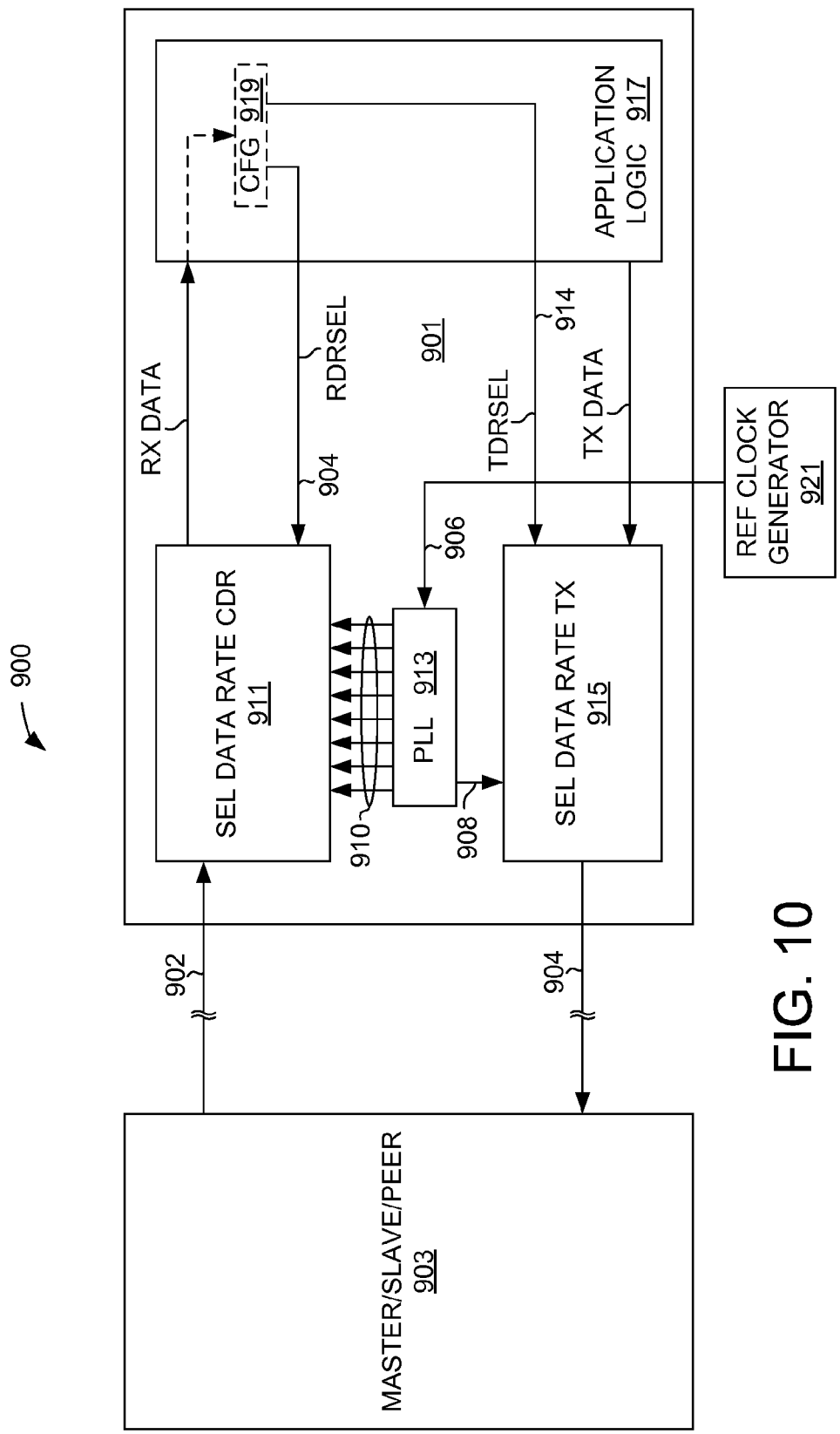
FIG. 10 illustrates a system in which a selectable data rate CDR circuit and/or selectable data rate transmit circuit according to embodiments described in reference to FIGS. 2-9 may be used.

FIG. 10 illustrates a system 900 in which a selectable data rate CDR circuit and/or selectable data rate transmit circuit according to embodiments described above in reference to FIGS. 2-9 may be used. The system 900 may be used, for example, within a computing device (e.g., mobile, desktop or larger computer), networking equipment (e.g., switch, router, etc.), consumer electronics device (e.g., telephone, camera, personal digital assistant (PDA), etc.), or any other type of device in which a CDR circuit or transmit circuit may be used.

The system includes a pair of integrated circuits (ICs) 901 and 903 coupled to one another via alternately directed signal paths 902 and 904. In the embodiment shown, the signal paths 902 and 904 are unidirectional high speed serial links for conducting serialized transmissions from one IC to the other. In alternative embodiments, either or both of the links may be bi-directional, and multiples of such signal paths may be provided to enable transmission of parallel groups of bits (e.g., each group of bits forming a data or control word (e.g., command, address, etc.) or portion of a data or control packet). The ICs 901 and 903 may be peers (e.g., each IC being capable of independently initiating a signal transmission to the other), or master and slave. Also, the relative status of the ICs may change from time-to-time such that one IC is a master at a first time, then a slave at another time, and/or a peer at another time.

IC 901 is shown in simplified block diagram form and includes a selectable data rate transmit circuit 915, PLL circuit 913, selectable data rate CDR circuit 911, and application logic 917. The PLL circuit 913 is coupled to receive a reference clock signal 906 from an off-chip reference clock generator 821 (although the reference clock generator 821 may be included within IC 901 in alternative embodiments), and outputs a phase-locked transmit clock signal 908 to the selectable data rate transmit circuit 915 and a set of phase vectors 910 to the selectable data rate CDR circuit 911. The selectable data rate CDR circuit 911 operates as described above in reference to FIGS. 2-7 to recover clock and data signals from an incoming data signal having a data rate indicated by receive data rate select signal 904 (e.g., a QDR, DDR, SDR, HDR or other data rate). Data recovered by the CDR circuit 911 is provided to the application logic 917 as receive data (RX DATA), and the application logic 917 outputs transmit data (TX DATA) to transmit circuit 915 for transmission on path 904. The selectable data rate transmit circuit operates as described above in reference to FIGS. 8 and 9 to output the transmit data on path 904 at a data rate indicated by transmit data rate select signal 914 (e.g., a QDR, DDR, SDR, HDR or other data rate). Because separate transmit and receive data rate select signals are provided, different transmit and receive data rates may be selected. Alternatively, a single data rate select signal may be used to control both the receive and transmit data rates. Also, separate data rate select signals may be used for each device interface (e.g., one data rate select signal for each incoming signal path and one data rate select signal for each outgoing signal path, or one data rate select signal for each bidirectional interface). For example, in one embodiment, the integrated circuit 901 includes a first interface for bidirectional communication with a first external device, and a second interface for bidirectional communication with a second external device, each of the first and second interfaces having independently selectable data rates so that, if necessary, the integrated circuit 901 may communicate with the first external device at a first data rate, and with the second external device at a second, slower data rate.

In the embodiment of FIG. 10, a configuration storage circuit 919 (e.g., run-time programmable register, non-volatile storage, fused storage, etc.) within the application logic 917 is used to store a first data rate select value that sets the state of the receive data rate select signal 904 (e.g., one of two states, one of three states, etc.) and a second data rate select value that sets the state of the transmit data rate select signal 914 (a single data rate select value may alternatively be used to set the states of both the receive and transmit data rate select signals). In one embodiment, the IC 903 is designed and/or programmed to issue one or more configure commands (or requests or instructions) to the IC 901 to store the first and second data rate values in the configuration storage circuit 919. Each data rate value (or both) may be provided, for example, in an operation code of the configure command or as associated operand data. The application logic 917 responds to the configure command by storing the indicated data rate select value within the configuration storage circuit 919, and issuing a corresponding data rate select signal to the selectable data rate CDR circuit 911 or the selectable data rate transmit circuit 915, as the case may be. At system power up the IC 901 may default to a predetermined data rate to enable reliable communication of the configure command and data rate select values. Alternatively, out of band signaling (e.g., by a separate path or protocol) may be used to communicate the data rate select values to the IC 901. Note that the configuration storage circuit 919 may be located elsewhere in the IC 901 in alternative embodiments and the transmit and receive data rate select values may alternatively be stored in separate configuration storage circuits.

Although two ICs 901 and 903 are shown in FIG. 10, the circuits within each of the ICs may alternatively be implemented in a single IC (e.g., in a system-on-chip or similar application), with signal paths 902 and 904 being routed via one or more metal layers or other signal conducting structures fabricated within the IC. Also, if distinct ICs are used as shown in FIG. 10, the ICs may be packaged in separate IC packages (e.g., plastic or ceramic encapsulation, bare die package, etc.) or in a single IC package (e.g., multi-chip module, paper thin package (PTP), etc.).

Reflecting generally on the transceiver architecture described in reference to FIGS. 2-10, it should be noted that numerous changes may be made without departing from the spirit and scope of the present invention. For example, while the selectable data rate CDR circuit has been described as including a phase mixer to interpolate between a selected pair of input phase vectors, the phase mixer and phase vectors may be omitted in an alternative embodiment, and a VCO or similar circuit (i.e., circuit having a controllable oscillation frequency) may be controlled directly by a phase control signal generated within the CDR circuit (e.g., the U/D signal generated by phase control circuit 211 of FIG. 2). Similarly, although the selectable data rate transmit circuit has been described as receiving a PLL-generated transmit clock signal, the transmit circuit may alternatively include a phase mixer to generate a transmit clock signal by selecting and interpolating between an input set of phase vectors. Further, while the selectable data rate CDR and transmit circuits have been described as receiving timing signals (i.e., clock and/or phase vector signals) from a shared PLL circuit, separate PLL circuits (or other timing control circuits such as delay locked loop circuits) may be used to provide timing signals for the CDR circuit and transmitter circuit in alternative embodiments.

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of controlling an integrated circuit device, the method comprising:
outputting a value indicative of a data rate to the integrated circuit device; and
outputting a command to the integrated circuit device to store the value in a configuration storage circuit within the integrated circuit device, the configuration storage circuit coupled to a clock data recovery (CDR) circuit within the integrated circuit device to control, based on the value, the selection of samples of an input signal used for recovering a clock signal from the input signal.

2. The method of claim 1 wherein outputting the value comprises outputting a configuration instruction to the integrated circuit device, the value including operand data of the configuration instruction.

3. The method of claim 1 wherein outputting the value comprises outputting a configuration instruction to the integrated circuit device, the value including an operation code of the configuration instruction.

4. The method of claim 1 wherein outputting the value to the integrated circuit device comprises outputting a value indicative of a number of data values included within the input signal per a cycle of the clock signal.

5. A method of controlling an integrated circuit device, the method comprising:
outputting a value indicative of a data rate to the integrated circuit device; and
outputting a command to the integrated circuit device to store the value in a configuration storage circuit within the integrated circuit device, the configuration storage circuit coupled to a transmit circuit within the integrated circuit device to select, based on the value, from one of a first output order of data bits within a first outbound data value and a second output order of data bits within a second outbound data value, the first output order corresponding to a first output data rate and the second output order corresponding to a second output data rate.

6. The method of claim 5 wherein outputting the value comprises outputting a configuration instruction to the integrated circuit device, the value including operand data of the configuration instruction.

7. The method of claim 5 wherein outputting the value comprises outputting a configuration instruction to the integrated circuit device, the value including an operation code of the configuration instruction.

8. A method of controlling an integrated circuit device, the method comprising:
outputting, from a master device, a value indicative of a data rate to the integrated circuit device; and
outputting, from the master device, a command to the integrated circuit device to store the value in a configuration storage circuit within the integrated circuit device, the configuration storage circuit coupled to a clock data recovery (CDR) circuit within the integrated circuit device to control, based on the value, the selection of samples of an input signal used for recovering a clock signal from the input signal.

9. The method of claim 8 wherein outputting the value comprises outputting a configuration instruction to the integrated circuit device, the value including operand data of the configuration instruction.

10. The method of claim 8 wherein outputting the value comprises outputting a configuration instruction to the integrated circuit device, the value including an operation code of the configuration instruction.

11. The method of claim 8 wherein outputting the value to the integrated circuit device comprises outputting a value indicative of a number of data values included within the input signal per a cycle of the clock signal.

12. A method of controlling an integrated circuit device, the method comprising:
outputting, from a master device, a value indicative of a data rate to the integrated circuit device; and
outputting, from the master device, a command to the integrated circuit device to store the value in a configuration storage circuit within the integrated circuit device, the configuration storage circuit coupled to a transmit circuit within the integrated circuit device to select, based on the value, from one of a first output order of data bits within a first outbound data value and a second output order of data bits within a second outbound data value, the first output order corresponding to a first output data rate and the second output order corresponding to a second output data rate.

13. The method of claim 12 wherein outputting the value comprises outputting a configuration instruction to the integrated circuit device, the value including operand data of the configuration instruction.

14. The method of claim 12 wherein outputting the value comprises outputting a configuration instruction to the integrated circuit device, the value including an operation code of the configuration instruction.

15. A method of controlling an integrated circuit device, the method comprising:
    receiving, at an interface of the integrated circuit device, a value indicative of a data rate of an input signal to be provided to the integrated circuit device;
    receiving, at the interface of the integrated circuit device, an input signal having the data rate; and
    sampling, by the integrated circuit device, the input signal to obtain a clock signal in response to the value.

16. The method of claim 15 further comprising receiving, at the interface of the integrated circuit device, a command to store the value in a configuration storage circuit within the integrated circuit device, the configuration storage circuit coupled to a clock data recovery (CDR) circuit within the integrated circuit device to control, based on the value, the selection of samples of the input signal.

17. The method of claim 15 wherein the value and input signal are received from a signal path coupled to the interface.

18. The method of claim 15 wherein the integrated circuit device receives the value before receiving the input signal.

19. The method of claim 15 wherein receiving the value comprises receiving a configuration instruction at the interface of the integrated circuit device, the value including an operand data of the configuration instruction.

20. The method of claim 15 further comprising:
    outputting, from another integrated circuit device, the value onto a signal path coupled to the interface; and
    outputting, from the another integrated circuit device, the input signal onto the signal path.

* * * * *